(12) United States Patent
Degani et al.

(10) Patent No.: US 6,369,444 B1
(45) Date of Patent: *Apr. 9, 2002

(54) PACKAGING SILICON ON SILICON MULTICHIP MODULES

(75) Inventors: Yinon Degani, Highland Park; Thomas Dixon Dudderar, Chatham; King Lien Tai, Berkeley Heights, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/081,448

(22) Filed: May 19, 1998

(51) Int. Cl.$^7$ ............................................... H01L 23/34
(52) U.S. Cl. ........................ 257/724; 257/686; 257/738
(58) Field of Search ............................... 257/685, 686, 257/728, 679, 723, 738, 777, 778, 690, 724, 707; 438/107, 108, 109; 361/717, 722, 761; 29/830

(56) References Cited

U.S. PATENT DOCUMENTS

| | | | | |
|---|---|---|---|---|
| 5,198,963 A | * | 3/1993 | Gupta et al. ................. | 361/386 |
| 5,576,630 A | * | 11/1996 | Fujita ........................... | 324/760 |
| 5,578,868 A | * | 11/1996 | Obuchi et al. ............... | 257/679 |
| 5,600,543 A | * | 2/1997 | Sanemitsu ..................... | 361/737 |
| 5,608,262 A | * | 3/1997 | Degani et al. ................ | 257/723 |
| 5,646,828 A | * | 7/1997 | Degani et al. ................ | 361/715 |
| 5,715,144 A | * | 2/1998 | Ameen et al. ................ | 361/790 |
| 5,790,384 A | * | 8/1998 | Ahmad et al. ................ | 361/760 |
| 5,821,762 A | * | 10/1998 | Hamaguchi et al. ......... | 324/754 |
| 5,869,894 A | * | 2/1999 | Degani et al. ................ | 257/723 |
| 5,907,903 A | * | 6/1999 | Ameen et al. ................. | 29/830 |
| 5,978,228 A | * | 11/1999 | Borkar .......................... | 361/753 |
| 6,054,008 A | * | 4/2000 | Chan ............................ | 257/753 |

FOREIGN PATENT DOCUMENTS

| | | | |
|---|---|---|---|
| JP | 3-179769 | * | 8/1991 |
| JP | 5-048000 | * | 2/1993 |

* cited by examiner

Primary Examiner—Olik Chaudhuri
Assistant Examiner—Nathan W. Ha
(74) Attorney, Agent, or Firm—Peter V. D. Wilde; Thomas, Kayden, Horstemeyer & Risley LLP

(57) ABSTRACT

The specification describes interconnection assemblies for silicon-on-silicon multichip modules. The silicon-on-silicon MCMs are mounted on epoxy/glass laminates which have a coefficient of thermal expansion (CTE) that essentially matches the CTE of silicon. In the preferred embodiment the assembly is a PC card with card edge connectors, i.e. without fixed solder interlevel interconnections, so that the CTE of the epoxy laminate comprising the card can be modified without regard to potential mismatch with a mother board.

12 Claims, 1 Drawing Sheet

PACKAGING SILICON ON SILICON MULTICHIP MODULES

FIELD OF THE INVENTION

This invention relates to techniques for packaging silicon interconnection substrates in multi-chip-module (MCM) assemblies.

BACKGROUND OF THE INVENTION

Use of silicon-on-silicon in premium interconnection assemblies is increasingly attractive due in part to the nearly optimum thermomechanical design made possible by the match between the Coefficient of Thermal Expansion (CTE) of the silicon chip and the silicon interconnection substrate. In state of the art silicon-on-silicon packages that provide ultra-high density, the silicon-on-silicon MCM is attached to an intermediate interconnection substrate, and the intermediate interconnection substrate is in turn mounted on a mother board. While it would seem ideal from the standpoint of thermomechanical design to construct all board levels of silicon, the size of the mother boards, and even the size of the intermediate boards, makes this option prohibitively costly. Therefore both the interconnection boards and the mother boards in multiboard assemblies are typically epoxy/glass laminates. Typical polymer laminates are not well matched thermomechanically to the silicon-on-silicon interconnection assembly. The CTE of FR-4, the most widely used epoxy laminate printed wiring board (PWB) material, is approximately 16 ppm/° C. The CTE of silicon is 2.6 ppm/° C.

An approach to reducing the thermomechanical mismatch between the silicon-on-silicon assembly and the intermediate board would appear to be to construct the intermediate board of a plastic material that matches the CTE of silicon. However, the shortcoming of this approach is that the mismatch between the intermediate board and the conventional mother board is then unacceptable.

Solder bond interlevel interconnections, i.e. those between interconnection substrates, are known to deform plastically, and the lifetime limitation due to thermal fatigue of solder interconnections is known to proceed as the square of the strain in the interconnection. Therefore a reduction in differential expansion of relatively small proportions can be expected to have a significant impact on the useful lifetime of multiple board interconnection assemblies.

SUMMARY OF THE INVENTION

We have designed a silicon-on-silicon interconnection package that overcomes the deficiencies of the interconnection packages described above. In the package of the invention both the intermediate interconnection board and the mother board have a CTE that closely matches the CTE of silicon. The preferred embodiment of the invention is a PC card in which the problem of thermomechanical incompatibility between the intermediate interconnection substrate, with a modified CTE, and the mother board is eliminated. This arrangement allows total design freedom to optimize the thermomechanical compatibility between the silicon-on-silicon multi-chip module and the PWB of the PC card, and eliminates the problem of CTE mismatch between silicon and conventional epoxy laminate boards. In this package design strain of solder interconnections due to mismatch in CTE between the materials of adjacent board levels is largely eliminated and the lifetime of the solder interconnections is substantially improved. The assembly of the invention offers the additional advantage of allowing single silicon flip-chips to be surface mounted directly to the intermediate board level without significant CTE mismatch.

DETAILED DESCRIPTION

Figure 1:
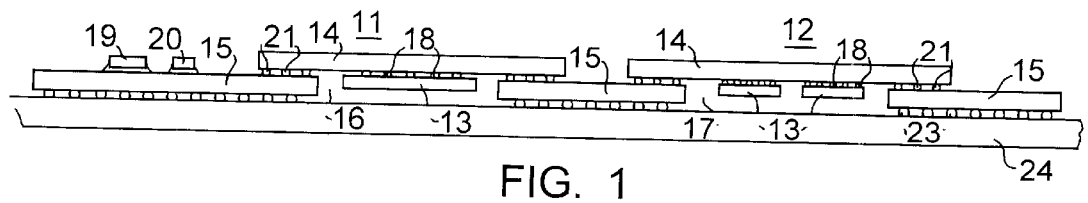
FIG. 1 is a schematic view of a printed wiring board assembly showing the silicon-on-silicon assembly attached to an intermediate interconnection board which in turn is mounted on a mother board.

Referring to FIG. 1 two silicon-on-silicon multi-chip-modules (MCMs) are shown generally at 11 and 12. The MCMs comprise silicon IC chips 13 flip-chip bonded to silicon interconnection substrates 14, or a single silicon chip flip-chip bonded to a silicon "fan-out" substrate, or a single silicon chip (or ensemble of chips patterned on a single piece of silicon) flip-chip bonded to a single silicon chip (or ensemble of chips patterned on a single piece of silicon). The silicon chips are IC (or library chips) bonded with either edge arrayed or area arrayed solder bumps to the silicon interconnection substrates. In this description the term solder bumps is used for convenience to generically describe solder interconnections in any suitable configuration or form. The solder interconnections between the silicon chips and the silicon interconnection substrate are shown at 18. FIG. 1 is a side section of the interconnection assembly. The dimensions of the interconnected elements are not necessarily to scale. The advantage of silicon-on-silicon MCMs, as earlier pointed out, is that the CTE of the chips and the substrate match.

In a conventional package, the silicon-on-silicon MCM is bonded to a laminated epoxy PWB. Printed circuits can be provided on the underside of the silicon substrate and the silicon substrate surface mounted onto the PWB. The preferred arrangement is to mount the silicon-on-silicon MCM in a flip-chip mode onto an intermediate PWB as shown in FIG. 1. The intermediate PWB is shown at 15 and has apertures 16 and 17 to allow the silicon chips 13 to extend beneath the surface of the intermediate board, thereby decreasing the vertical profile of the package. The silicon-on-silicon MCMs 11 and 12 are solder bonded to the intermediate interconnect substrate with solder bumps 21. This interconnection arrangement is described and claimed in U.S. Pat. No. 5,646,828, issued Jul. 8, 1997. The intermediate PWB may also have other soldered components such as capacitors and resistors, represented at 19 and 20 in FIG. 1, surface mounted on the PWB.

The laminated PWB 15 typically consists of epoxy/glass, commonly referred to in the art as FR-4. The CTE for this material is approximately 16 ppm/° C. For high density interconnect packages, the PWB 15 is, in turn, mounted with solder bumps 23 on another laminated board, shown in Fig at 24. PWB 24 is commonly referred to as a mother board and is typically the final level of interconnection. PWB 24 also comprises FR-4, or one of several alternative materials known in the art, which have comparable CTE values typically well above 10 ppm/° C. Efforts can be made to select laminated board materials that have matched CTE values, i.e. values close to 16 ppm/° C., to minimize the differential thermal expansion problems described earlier.

As will be appreciated by those skilled in the art, the thermomechanical properties of boards 15 and 24 are nominally compatible. However, there is a significant incompatibility in thermomechanical properties between PWB 15, and the silicon-on-silicon MCMs 11 and 12.

To overcome the thermomechanical incompatibility between silicon-on-silicon MCMs and the intermediate epoxy/glass laminated PWB according to a first aspect of the invention, the material of the PWB is modified to result in a CTE of the overall board of below 10 ppm/° C., and preferably below 6 ppm/° C. This can be achieved by adjusting the loading of the glass, or other fiber reinforcement material e.g. aramid, and other additives in the epoxy/glass PWB in known fashion, or by proper selection of the epoxy. The thermomechanical properties of epoxy and other suitable PWB materials are well known in the art. Materials with thermomechanical properties useful for the invention are polyimide/kevlar, epoxy/polyimide/kevlar, and epoxy/graphite. The reinforcement material, and the amount of reinforcement material in the laminate, can be chosen to provide a low CTE. For example, graphite fiber has a CTE of 0.5–1 ppm/° C., so that increasing the amount of graphite fiber in the laminate can reduce the CTE to desired levels.

Preferably the CTE of the PWB 15 is made comparable to that of silicon ±2 ppm/° C. If the mismatch is 1 ppm/° C. or less the epoxy underfill typically used in conventional flip-chip bonding may be unnecessary and can be eliminated. The material comprising the mother board 24 also preferably has a CTE comparable to those of the MCMs and the intermediate PWB 15, i.e. below 10 ppm/° C., and preferably below 6 ppm/° C., or within ±3 or ±1 ppm/° C.

Three level interconnect assemblies constructed according to these principles have unexpectedly low differential thermal expansion between levels, and the effective lifetime of the solder bumps interconnecting them will be substantially increased.

Figure 2:
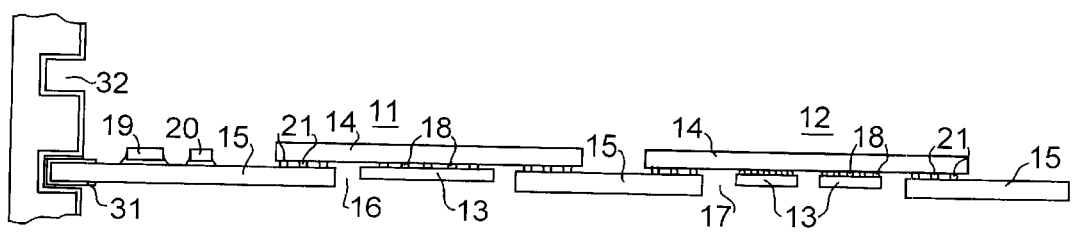
FIG. 2 is a schematic view of a PC card assembly according to the preferred embodiment of the invention in which the potential thermomechanical incompatibility between board levels in a silicon-on-silicon MCM package is eliminated.

An alternative approach to overcoming differential thermal expansion between board levels is shown in FIG. 2. In FIG. 2, the same reference numerals used in FIG. 1 designate the same elements. The silicon-on-silicon MCMs are the same and the intermediate interconnection substrate 15 is the same. In the arrangement of FIG. 2 however, the mother board 24 is eliminated and the intermediate interconnection substrate is constructed and used as a printed circuit card (PC card). In this mode the PC card is provided with card edge connections 31, which are adapted to engage slots 32. The slots are typically part of a computer.

To describe in general the application of the invention to commercial interconnect products the example of a PC card for a computer will be given below in detail. However, the invention can be incorporated with a variety of interconnect products, notably telecommunications products such as cellular or wireless station equipment, cellular phones, switching equipment, etc.

With rapidly advancing computer technology it is now conventional for computers, especially personal computers, to allow customizing, i.e. upgrades, enhancements, additions etc., of new accessories or system software improvements by simply installing new printed circuit cards in an existing computer. Such options include expansion boards, single in-line memory modules (SIMM), external peripherals for multimedia, modems, printers, fax, video DRAM chips, system processor upgrades, etc. This same capacity to use plug-in expansion boards or cards also allows easy assembly and repair of basic computer components that are typically part of the computer when purchased, e.g. hard disks, CD-ROM readers and diskette drives.

In a typical embodiment the PC cards are rectangular in shape with a relatively long side along which is disposed a row of contacts such as those known as "gold fingers" which are arrayed to fit into a standardized edge card connector (an in a SIMM card). Such contacts can also be disposed along one or both of the short sides of the PC card. The computer housing is provided with plug-in sites, typically referred to as PCI or ISA slots, for installing repair or expansion PC cards. These sites have rectangular slots, with channels typically along two or three sides, for mounting the cards. The slots have at least one socket with a linear array of contacts. The socket portion of the slot is typically positioned to engage the edge card connectors along the long dimension of the card, and is situated along the floor of the computer housing for a vertical card installation, or along a sidewall or partition in the computer for a horizontal card installation. The cards have a linear array of contacts that corresponds to the linear array of the socket so that when the cards are installed the contacts of the cards mate with, or plug into, the linear array of contacts in the socket. The size and spacing of the contacts on both the socket and the cards conform to industry standards. The PC cards are provided with conventional printed circuits for interconnecting the MCMs with the edge card connectors. The PC cards may be single or double sided, i.e. may contain MCMs or other components on one or both sides of the card. The arrangement shown in FIG. 2 is nominally for a single sided board with the printed circuit interconnections formed on the top surface of the board as shown. However, printed circuit interconnections can also be formed on the bottom side of PWB 24 to increase the interconnection capacity. Also, the MCMs can be mounted from either side of apertures 16 and 17, i.e. an MCM mounted from the top in aperture 16, and from the bottom in aperture 17. In this way the number of runners and the circuit capacity of the card can be increased.

Figure 3:
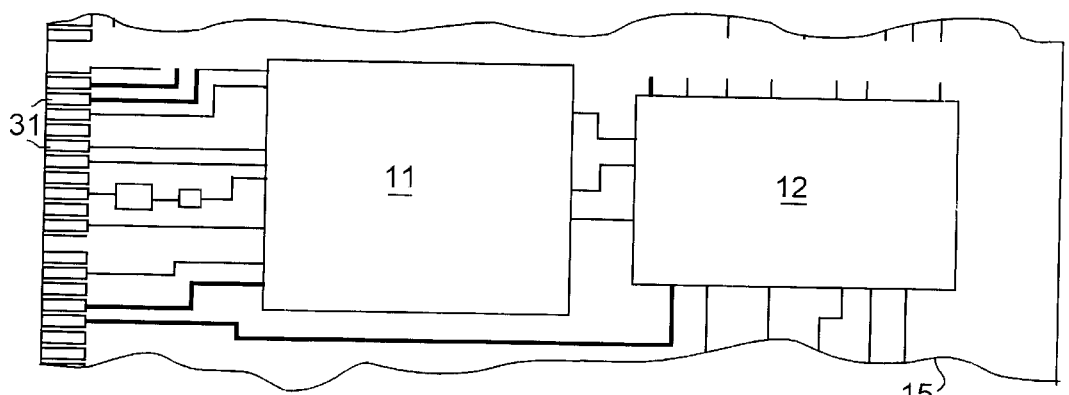
FIG. 3 is a plan view of a portion of the PC card of the invention.

A portion of the PC card is shown in plan view in FIG. 3. The view is taken across the width of the rectangular card 15. The card edge connectors 31 are seen more clearly in this view. The interconnections between MCM sites 11 and 12 and the card edge connectors 31 comprise a standard printed circuit.

It will be understood by those skilled in the art that this method of connectorization, i.e card edge connectorization, provides a much more compliant interconnection between the intermediate PWB and the host system in which it is installed. Use of this type of interconnection and consequent elimination of rigid solder connections at this board level allows the CTE of the intermediate PWB to be adjusted without regard to potential thermomechanical mismatch between the intermediate PWB and another board level, and allows the CTE to be reduced all the way down to the CTE of silicon. Other compliant connectorization methods that avoid rigid connection to a high CTE interconnect substrate are equivalent to the card edge connectors in this respect. For example, a plastic molded connector that has flexible metal leads that are soldered to the intermediate PWB meets this objective. Such connector arrangements will be referred to herein as edge connectors.

It will also be understood by those skilled in the art that the use of an apertured board of the kind described herein as the preferred form of the invention itself eases the thermal expansion problems described earlier due to the significantly reduced mass of board, especially the mass of board under the MCM. Therefore the stresses in the interconnections of the MCM module due to thermal mismatch between the MCM and the board on which it is mounted are inherently lower. The combination of the apertured board, and the approximate match of the CTE of the intermediate board with silicon, result in a very robust and low stress package.

Figure 4:
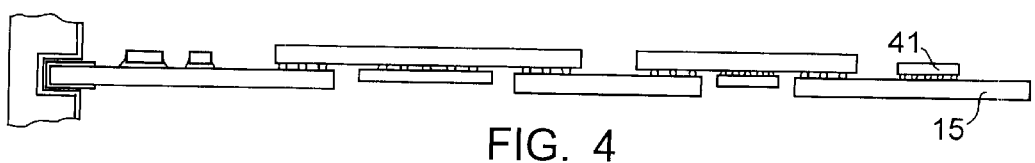
FIG. 4 is a view similar to that of FIG. 2 illustrating an additional advantage of the invention.

A further advantage of the arrangement of the invention is that silicon IC chips can be flip-chip bonded directly to the intermediate interconnection substrate. This expedient is effective due to the match of the CTE of laminated PWB 15 to the CTE of silicon. FIG. 4 shows this embodiment with silicon IC chip 41 flip-chip bonded directly to laminated PWB 15. An epoxy underfill can be used to fill the space between chip 41 and PWB 15. However, as mentioned earlier, if the CTE mismatch between the PWB and the silicon chip is reduced sufficiently according to the invention, and/or the chip is sufficiently small, the epoxy underfill may be unnecessary.

As used herein the term intermediate interconnection substrate generally defines an assembly in which the intermediate interconnection substrate is mounted on a mother board. For purposes of definition the PWB to which the intermediate interconnection substrate is mounted may be referred to as the primary PWB. The preferred intermediate interconnection substrate according to the invention contains apertures as shown in FIGS. 1, 2 and 4, with the MCMs mounted in the recesses so that the flip-chips are recessed below the surface of the intermediate PWB. The primary PWB is shown in these figures as a conventional board with the intermediate PWBs surface mounted thereon. In a typical package two or more intermediate PWBs will be mounted on the primary PWB. The primary PWB can also be apertured, and the intermediate PWBs depending in the apertures, in a manner similar to that shown for the MCM/intermediate PWB combination. However, as understood from the foregoing description the primary PWB of the combinations just described is eliminated the preferred embodiment.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An integrated circuit package comprising in combination:
   a. a primary printed wiring board,
   b. at least two intermediate printed wiring boards solder bonded to said primary printed wiring board,
   c. at least one silicon-on-silicon multichip module solder bonded to one of said intermediate printed wiring boards, said silicon-on-silicon multichip module comprising at least one silicon integrated circuit chip bonded to a silicon interconnection substrate, and
   an improvement comprising:
   said primary printed wiring board and said at least one intermediate printed wiring board having a coefficient of thermal expansion of less than 10 ppm/° C.

2. The integrated circuit package of claim 1 in which the primary printed wiring board and the at least on intermediate printed wiring board have a coefficient of thermal expansion that matches the coefficient of thermal expansion of silicon ±2 ppm/° C.

3. The integrated circuit package of claim 1 in which the at least one intermediate printed wiring board has at least one aperture therein, and said silicon-on-silicon MCM is mounted in said aperture in a flip-chip configuration with the silicon integrated circuit chips on the silicon interconnection substrate depending into said aperture.

4. A PC card comprising:
   a. a printed wiring board having a printed circuit on at least one side thereof,
   b. at least one silicon-on-silicon multichip module solder bonded to said printed wiring board, said silicon-on-silicon multichip module comprising at least one silicon integrated circuit chip bonded to a silicon interconnection substrate,
   c. a plurality of card edge connections extending along at least one edge of said printed wiring board, said card edge connections being interconnected to said silicon-on-silicon multichip module by said printed circuit, and
   an improvement comprising:
   said printed wiring board has a coefficient of thermal expansion of less than 10 ppm/° C.

5. The PC card of claim 4 in which the printed wiring board has a coefficient of thermal expansion of less than 6 ppm/° C.

6. The PC card of claim 4 in which the printed wiring board has a coefficient of thermal expansion that matches the coefficient of thermal expansion of silicon ±2 ppm/° C.

7. The PC card of claim 4 in which said printed wiring board has at least one aperture therein, and said silicon-on-silicon MCM is mounted in said aperture in a flip-chip configuration with the silicon integrated circuit chips on the silicon interconnection substrate depending into said aperture.

8. An IC assembly comprising:
   a. an intermediate printed wiring board (IPWB) having a picture frame structure with a first side and a second side and an opening through said IPWB, a first array of IPWB interconnection sites on first side of said picture frame structure and a second array of IPWB interconnection sites on the second side of said picture frame structure, and
   b. a multichip module (MCM) comprising:i.
      i. a silicon interconnection substrate having a first side and a second side with a first array of substrate interconnection sites adapted to be interconnected to a silicon IC chip,
      ii. a second array of substrate interconnection sites on said silicon interconnection substrate on the first side of the interconnection substrate, and
   said second array of substrate interconnection sites adapted for interconnection with said second array of IPWB interconnection sites, and
      iii. at least one silicon IC chip having a circuit side and an under side, with an array of chip interconnection sites on said circuit side of said silicon IC chip, said array of chip interconnection sites bonded to said first array of substrate interconnection sites,
   said MCM (b) being interconnected to said IPWB (a) with said second array of substrate interconnection sites being solder bonded to said second array of IPWB interconnection sites, and with said MCM at least partially contained in said opening in said IPWB, said IPWB having a coefficient of thermal expansion of less than 10 ppm/° C.

9. The IC assembly of claim 8 wherein the IPWB has a coefficient of thermal expansion of less than 6 ppm/° C.

10. The IC assembly of claim 8 wherein the IPWB has a coefficient of thermal expansion that matches the coefficient of thermal expansion of the MCM ±2 pm/° C.

11. The IC assembly of claim 8 wherein said first array of IPWB interconnection sites comprise card edge connectors.

12. The IC assembly of claim 11 in combination with a computer, said computer having an array of edge card connector slots, and said edge card connectors of said IPWB engaging said edge card connector slots.

* * * * *